(12) United States Patent
Cho et al.

(10) Patent No.: US 10,650,749 B2
(45) Date of Patent: May 12, 2020

(54) ORGANIC LIGHT EMITTING DIODE DISPLAY

(71) Applicant: SAMSUNG DISPLAY CO., LTD., Yongin-si, Gyeonggi-do (KR)

(72) Inventors: Hyun Duck Cho, Anyang-si (KR); Seung-Kyu Lee, Asan-si (KR); Hyun Woong Kim, Gwangmyeong-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 85 days.

(21) Appl. No.: 15/865,949

(22) Filed: Jan. 9, 2018

(65) Prior Publication Data

US 2018/0286314 A1 Oct. 4, 2018

(30) Foreign Application Priority Data

Mar. 31, 2017 (KR) .................. 10-2017-0041766

(51) Int. Cl.
| | | |
|---|---|---|
| *G09G 3/3258* | (2016.01) | |
| *H01L 51/52* | (2006.01) | |
| *H01L 27/12* | (2006.01) | |
| *H01L 27/32* | (2006.01) | |

(Continued)

(52) U.S. Cl.
CPC ......... *G09G 3/3258* (2013.01); *H01L 27/127* (2013.01); *H01L 27/1222* (2013.01); *H01L 27/1255* (2013.01); *H01L 27/3262* (2013.01); *H01L 29/78696* (2013.01); *H01L 51/5203* (2013.01); *G09G 3/3233* (2013.01); *G09G 2300/0819* (2013.01); *G09G 2300/0842* (2013.01); *G09G 2300/0861* (2013.01); *G09G 2310/0264* (2013.01); *H01L 27/3248* (2013.01); *H01L 27/3265* (2013.01); *H01L 27/3276* (2013.01)

(58) Field of Classification Search
CPC ..... G09G 3/3233; G09G 3/3258; H01L 27/12
USPC .................................................. 345/76, 690
See application file for complete search history.

(56) References Cited

U.S. PATENT DOCUMENTS

| | | | |
|---|---|---|---|
| 10,115,781 B2* | 10/2018 | Huang | ............... H01L 27/3279 |
| 2007/0194320 A1* | 8/2007 | Cho | ................. G02F 1/136227 |
| | | | 257/72 |
| 2015/0130691 A1 | 5/2015 | Jeon | |

(Continued)

FOREIGN PATENT DOCUMENTS

| | | |
|---|---|---|
| KR | 10-2003-0086168 | 11/2003 |
| KR | 10-0658288 | 12/2006 |

(Continued)

*Primary Examiner* — Calvin C Ma
(74) *Attorney, Agent, or Firm* — F. Chau & Associates, LLC

(57) ABSTRACT

An embodiment provides an organic light emitting diode display including: a substrate; a scan line disposed on the substrate to transfer a scan signal; a data line disposed on the substrate to transfer a data signal; a driving voltage line disposed on the substrate to transfer a driving voltage; a switching transistor connected with the scan line and the data line; a driving transistor connected with the switching transistor; and an organic light emitting diode electrically connected to the driving transistor, wherein the driving transistor includes a gate electrode, a source electrode, a drain electrode, and a plurality of channels, and each of the channels includes a plurality of curved portions.

21 Claims, 11 Drawing Sheets

(51) Int. Cl.
   *H01L 29/786*   (2006.01)
   *G09G 3/3233*   (2016.01)

(56) References Cited

U.S. PATENT DOCUMENTS

2016/0141350 A1* 5/2016 Kim .................... H01L 27/3276
                                                    257/40
2016/0217746 A1* 7/2016 An ........................ G09G 3/3233
2017/0330927 A1* 11/2017 Lee ..................... H01L 27/3272

FOREIGN PATENT DOCUMENTS

KR   10-2008-0086598    9/2008
KR   10-2014-0018623    2/2014

* cited by examiner

ORGANIC LIGHT EMITTING DIODE DISPLAY

CROSS-REFERENCE TO RELATED APPLICATION

This application claims priority to and the benefit of Korean Patent Application No. 10-2017-0041766 filed in the Korean intellectual Property Office on Mar. 31, 2017, the entire contents of which are incorporated by reference herein.

TECHNICAL FIELD

The technical field of the inventive concept relates to an organic light emitting diode display.

DISCUSSION OF THE RELATED ART

An organic light emitting diode display includes, for example, two electrodes and an organic emission layer disposed therebetween. Electrons injected from a cathode which is a first electrode and holes injected from an anode which is a second electrode are combined in the organic emission layer to generate excitons, and the excitons emit light while emitting energy.

The organic light emitting diode display includes a plurality of pixels, each of which includes an organic light emitting diode including a cathode, an anode, and an organic emission layer, and each of the pixels includes a capacitor and transistors for driving the organic light emitting diode. Basically, the transistors may include a switching transistor and a driving transistor, and may further include an additional transistor such as a compensation transistor.

The organic light emitting diode display is a current driven device, and thus uniform transistor characteristics (e.g., threshold voltage, electron mobility, etc.) may result in a more uniform display characteristic. When the organic light emitting diode display is used in bright surroundings, for example, in an outdoor environment, there is a demand for a high-luminance organic light emitting diode display since the organic light emitting diode is required to emit light at a high luminance to enable image identification.

The information disclosed above is provided only to enhance understanding of the inventive concept and therefore it may contain information that is not known to a person of ordinary skill in the art.

SUMMARY

The inventive concept provides an organic light emitting diode display having relatively high luminance.

An embodiment of the inventive concept provides an organic light emitting diode display including: a substrate; a scan line disposed on the substrate to transfer a scan signal; a data line disposed on the substrate to transfer a data signal; a driving voltage line disposed on the substrate to transfer a driving voltage; a switching transistor connected with the scan line and the data line; a driving transistor connected with the switching transistor; and an organic light emitting diode electrically connected to the driving transistor, wherein the driving transistor includes a gate electrode, a source electrode, a drain electrode, and a plurality of channels, and each of the channels includes a plurality of curved portions.

The channels may be disposed between the source electrode and the drain electrode, and may be electrically connected in parallel by the source electrode and the drain electrode.

The channels may include, for example, a first channel and a second channel, and the first channel and the second channel may be symmetrical with respect to an axis therebetween.

The first channel and the second channel may be separated from each other.

The first channel and the second channel may be connected with each other.

The organic light emitting diode display may further include a storage electrode that overlaps the gate electrode and constitutes a storage capacitor together with the gate electrode, and the storage electrode may have an opening positioned between the first channel and the second channel.

The channels may have the same or similar shape and size.

Each of the channels may have an approximately $\Omega$-shape including four bent portions.

The gate electrode may include a first gate electrode and a second gate electrode separated from each other, and the channels may include a first channel and a second channel separated from each other. The first gate electrode may overlap the first channel, and the second gate electrode may overlap the second channel.

The source electrode, the drain electrode, and the channels may be formed in one semiconductor.

An embodiment of the inventive concept provides an organic light emitting diode display including: a scan line configured to transfer a scan signal; a data line configured to transfer a data signal; a driving voltage line configured to transfer a driving voltage; a switching transistor connected with the scan line and the data line; a driving transistor connected with the switching transistor; and an organic light emitting diode configured to receive a driving current of the driving transistor to emit light, wherein the driving transistor includes a plurality of channels connected in parallel, and each of the channels is bent in a plan view.

In an embodiment of the inventive concept, when the switching transistor is turned on the data signal is transferred to the source electrode of the driving transistor, and the organic light emitting diode display further includes a compensation transistor that connects the drain electrode of the driving transistor to the gate electrode of the driving transistor.

In an embodiment of the inventive concept, a driving transistor for a light emitting diode display includes a drain electrode; a source electrode; a gate electrode; a plurality of channels disposed between the source electrode and the drain electrode, wherein each of the plurality of channels are symmetrical with respect to an axis therebetween, and each one of the plurality of channels includes a plurality of curved portions.

In an embodiment of the inventive concept, each of the plurality of channels of the driving transistor has an approximate $\Omega$-shape including four bent portions.

In an embodiment of the inventive concept, the plurality of channels of the driving transistor comprises two channels including a first driving channel extending downward in a diagonal direction and a second driving channel extending upward in the diagonal direction, and the first driving channel and the second driving channel intersect at approximately a central portion of the gate electrode.

In an embodiment of the inventive concept, the plurality of channels of the driving transistor comprises two channels including a first driving channel having four curved portions and a second driving channel having two bendable portions, wherein the first driving channel and the second driving channel cross each other at about a central portion of the gate electrode.

In an embodiment of the inventive concept, the plurality of channels of the driving transistor comprises two channels including a first driving channel and a second driving channel, and the gate electrode comprises a plurality of gate electrodes separately formed to correspond to the respective first driving channel and second driving channel, and each respective driving channels individually compensated.

In an embodiment of the inventive concept, the plurality of channels of the driving transistor comprises two channels longitudinally formed including a first driving channel and a second driving channel, each of the first driving channel and the second driving channel includes three horizontal portions substantially in parallel with a first direction x and two vertical portions substantially in parallel with a second direction y.

In an embodiment of the inventive concept, an organic light emitting display includes a substrate; at least one scan line disposed on the substrate; at least one data line disposed on the substrate; a driving voltage line disposed on the substrate; a switching transistor connected with the scan line and the data line; a driving transistor connected with the switching transistor; and an organic light emitting diode electrically connected to the driving transistor, wherein the driving transistor includes: a drain electrode; a source electrode; a gate electrode; a plurality of channels disposed between the source electrode and the drain electrode, wherein each of the plurality of channels are symmetrical with respect to an axis there between.

According to the embodiments of the inventive concept, it is possible to provide an organic light emitting diode display capable of supplying a high current for the high luminance to the organic light emitting diode while preventing occurrence of a stain defect.

BRIEF DESCRIPTION OF THE DRAWINGS

FIGS. 7 to 15 schematically illustrate planar shapes of a gate electrode and a semiconductor layer of a driving transistor according to one or more embodiments of the inventive concept in which:

FIG. 7 shows a driving transistor with two driving channels that overlap the gate electrode according to an embodiment of the inventive concept;

FIG. 8 shows a driving transistor with three driving channels that has an omega shape according to an embodiment of the inventive concept;

FIG. 9 shows a driving transistor with the first and second driving channels of the driving transistor T1 having a shape in which they are attached to each other;

FIG. 10 shows a driving transistor in which one driving channel branches into the upper first driving channel 131a and the lower second driving channel 131a2, and then merges into one driving channel;

FIG. 11 shows a driving transistor that includes a connection channel for connecting the first driving channel and the second driving channel in a horizontal direction;

FIG. 12 shows the driving transistor includes a first driving channel and a second driving channel, each of which includes two curved portions;

FIG. 13 shows a driving transistor in which the first driving channel of the driving transistor includes four curved portions, and the second driving channel includes two bendable portions;

FIG. 14 shows the driving transistor includes a first driving channel extending downward in a diagonal direction and a second driving channel extending upward in the diagonal direction; and FIG. 15 shows a driving transistor in which the gate electrode is separated into a first gate electrode and a second gate electrode.

DETAILED DESCRIPTION

Figure 1:
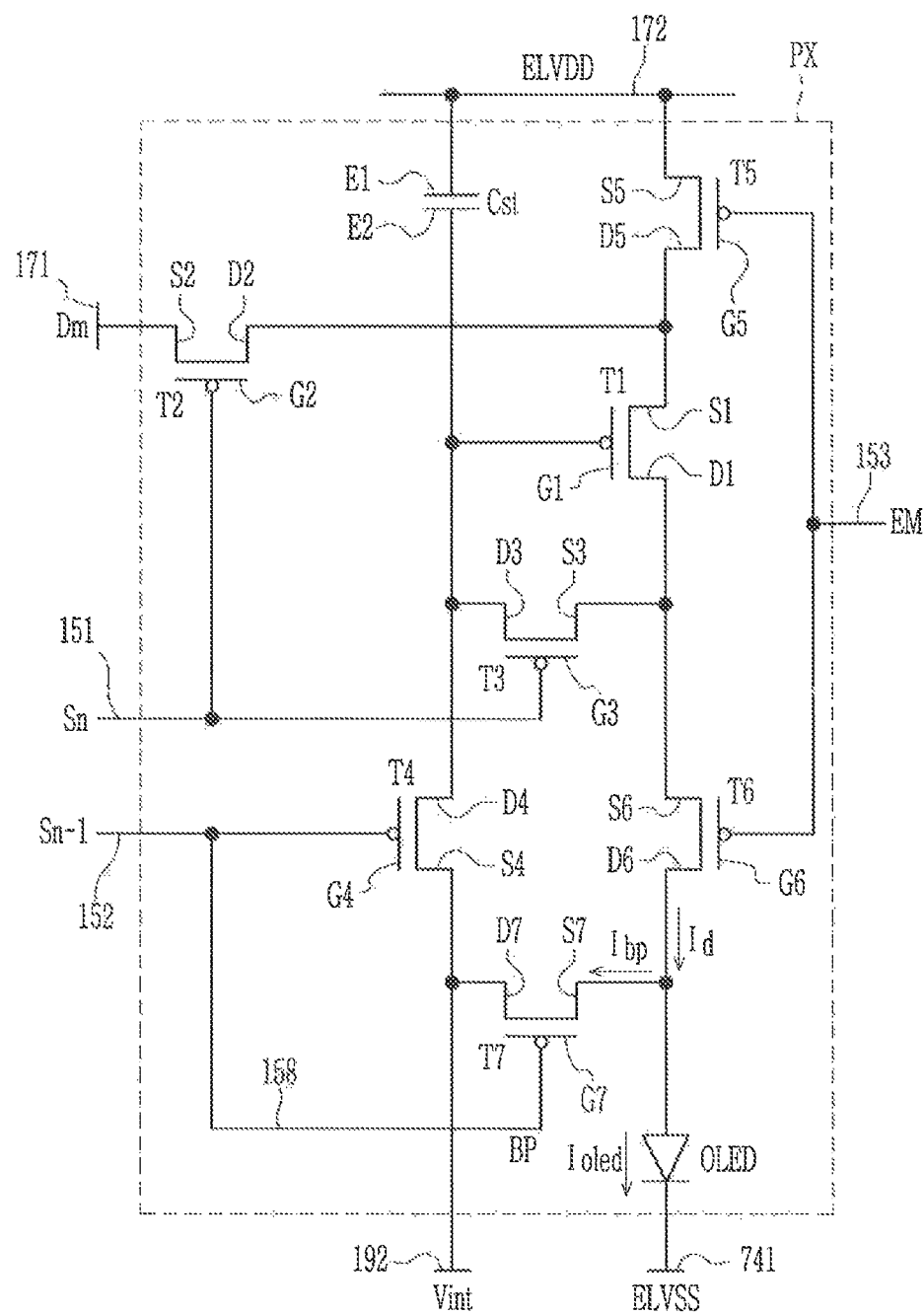
FIG. 1 is an equivalent circuit diagram illustrating an organic light emitting diode display according to an embodiment of the inventive concept.

The present inventive concept will now be described in more detail hereinafter with reference to the accompanying drawings, in which embodiments of the inventive concept are shown. As those skilled in the art would realize, the embodiments may be modified in various different ways, all without departing from the spirit or scope of the present inventive concept.

To illustrate the present inventive concept without obscuring same with unnecessary detail, parts that are irrelevant to the description are omitted, and like numerals may refer to like or similar constituent elements throughout the specification.

Further, since sizes and thicknesses of constituent members shown in the accompanying drawings are arbitrarily given for better understanding and ease of description, the present inventive concept is not limited to the illustrated sizes and thicknesses. In the drawings, the thickness of layers, films, panels, regions, etc., are exaggerated for clarity. In the drawings, for better understanding and ease of description, the thicknesses of some layers and areas are exaggerated.

A person of ordinary skill in the art should understand that when an element such as a layer, film, region, or substrate is referred to as being "on" another element, the element can be directly on the other element or intervening elements may also be present. In contrast, when an element is referred to as being "directly on" another element, there are no intervening elements present. Further, in the specification, the word "on" or "above" means positioned on or below the object portion.

In addition, unless explicitly described to the contrary, the word "comprise" and variations such as "comprises" or "comprising" will be understood to imply the inclusion of stated elements but not the exclusion of any other elements.

Hereinafter, an organic light emitting diode display according to embodiments of the inventive concept will be described in detail with reference to the accompanying drawings.

Figure 2:
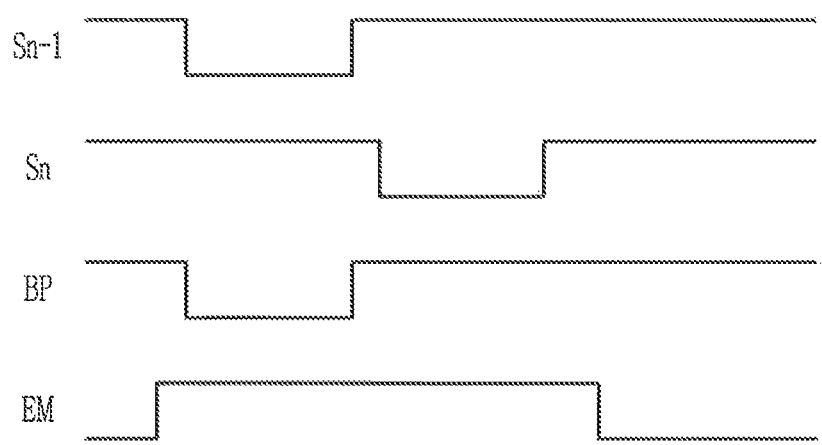
FIG. 2 is a timing diagram illustrating signals applied to one pixel in an organic light emitting diode display according to an embodiment of the inventive concept.

FIG. 1 is an equivalent circuit diagram illustrating an organic light emitting diode display according to an embodiment of the inventive concept, and FIG. 2 is a timing diagram illustrating signals applied to one pixel in an organic light emitting diode display according to an embodiment of the inventive concept.

Referring now to FIG. 1, each pixel PX of an organic light emitting diode display includes a plurality of transistors T1, T2, T3, T4, T5, T6, and T7 connected with a plurality of signal lines, such as 150, 152, 153, bypass control line 158, data line 171, driving voltage line 172, and initialization voltage line 192, at least one storage capacitor Cst, and an organic light emitting diode OLED. Although not illustrated, the organic light emitting diode display includes a display area (corresponding to a screen) on which images are displayed, and the pixels are arranged in, e.g., a matrix form in the display area.

With continued reference to FIG. 1, the transistors include, for example, a driving transistor T1 and a switching transistor T2, and may further include a compensation transistor T3, an initialization transistor T4, an operation control transistor T5, an emission control transistor T6, and a bypass transistor T7.

The signal lines may include a scan line 151, a previous scan line 152, an emission control line 153, a bypass control line 158, a data line 171, a driving voltage line 172, and an initialization voltage line 192.

The scan line 151 is connected with agate driver (not illustrated) to transfer a scan signal Sn to the switching transistor T2 and the compensation transistor T3. The previous scan line 152 is connected with the gate driver to transfer a previous scan signal Sn-1 to the initialization transistor T4. The emission control line 153 is connected with an emission controller (not illustrated) to transfer an emission control signal EM to the operation control transistor T5 and the emission control transistor T6. The bypass control line 158 transfers a bypass signal BP to the bypass transistor T7.

The data line 171 transfers a data signal Dm generated in a data driver (not illustrated), and the driving voltage line 172 transfers a driving voltage ELVDD. The initialization voltage line 192 transfers an initialization voltage Vint for initializing the transistor T1.

FIG. 1 also shows that the driving transistor T1 is connected with a first storage electrode E1 of a storage capacitor Cst. A source electrode S1 of the driving transistor T1 is connected with a driving voltage line 172 via the operation control transistor T5. A drain electrode D1 of the driving transistor T1 is connected with an anode of the organic light emitting diode OLED via the emission control transistor T6. The driving transistor T1 receives a data signal Dm depending on whether a switching operation of the switching transistor T2 is performed to transfer a driving current Id to the organic light emitting diode OLED shown in FIG. 1.

The switching transistor T2 includes a gate electrode G2 connected with scan line 151 and a source electrode S2 connected with the data line 171. The drain electrode D2 of the switching transistor T2 is connected with the source electrode S1 of the driving transistor T1, and is connected with the driving voltage line 172 via the operation control transistor T5. When the switching transistor T2 is turned on depending on whether the scan signal Sn transferred through the scan line 151, and whether the data signal Dm transferred through the data line 171 is transferred to the source electrode S1 of the driving transistor T1.

The compensation transistor T3 includes agate electrode G3 connected with the scan line 151, and a source electrode S3 connected with the drain electrode D1 of the driving transistor T1 and connected with the source electrode S6 of the emission control transistor T6. The drain electrode D3 of the compensation transistor T3 is connected with a drain electrode D4 of the initialization transistor T4, a first storage electrode E1 of the storage capacitor Cst, and a gate electrode G1 of the driving transistor T1. The compensation transistor T3 is turned on depending on whether the scan signal Sn transferred through the scan line 151 to connect the drain electrode D1 with the gate electrode G1 of the driving transistor T1, e.g., to diode-connect the driving transistor T1.

The initialization transistor T4 includes agate electrode G4 connected with the previous scan line 152 and a source electrode S4 connected with the initialization voltage line 192. The drain electrode D4 of the initialization transistor T4 is connected with the first storage electrode E1 of the storage capacitor Cst and the driving gate electrode G1 of the driving transistor T1 via the drain electrode D3 of the compensation transistor T3. The initialization transistor T4 is turned on depending on whether a previous scan signal Sn-1 transferred through the previous scan line 152 to transfer an initialization voltage Vint to the gate electrode G1 of the driving transistor T1. Accordingly, a gate voltage of the gate electrode G1 of the driving transistor T1 is initialized.

The operation control transistor T5 includes a gate electrode G5 connected with the emission control line 153 and a source electrode S5 connected with the driving voltage line 172. The drain electrode D5 of the operation control transistor T5 is connected with the source electrode S1 of the driving transistor T1 and the drain electrode D2 of the switching transistor T2. The emission control transistor T6 includes a gate electrode G6 connected with the emission control line 153 and a drain electrode D6 connected with the anode of the organic light emitting diode OLED. The source electrode S6 of the emission control transistor T6 is connected with the drain electrode D1 of the driving transistor T1 and the source electrode S3 of the compensation transistor T3. The operation control transistor T5 and the emission control transistor T6 are turned on together depending on whether the emission control signal EM transferred through the emission control line 153 so that the driving voltage ELVDD is compensated through the diode-connected driving transistor T1 to be transferred to the organic light emitting diode OLED.

The bypass transistor T7 includes agate electrode G7 connected with the bypass control line 158, a source electrode S7 connected with the drain electrode D6 of the emission control transistor T6 and the anode of the organic light emitting diode OLED, and a drain electrode D7 connected with the initialization voltage line 192 and the source electrode S4 of the initialization transistor T4. Since the bypass control line 158 is connected with the previous scan line 152, the bypass signal BP is identical to the previous scan signal Sn-1. The bypass control line 158 may not be connected to the previous scan line 152 and may transfer a signal that is different from the previous scan signal Sn-1.

A second storage electrode E2 of the storage capacitor Cst is connected with the driving voltage line 172. The cathode of the organic light emitting diode OLED is connected with a common voltage line 741 for transferring the common voltage ELVSS.

In the embodiment of FIG. 1, a pixel circuit includes, for example, seven transistors and one capacitor, but the present inventive concept is not limited thereto. For example, the number of transistors and the number of capacitors may be variously adjusted as desired.

An operation of one pixel of the organic light emitting diode display according to an embodiment will now be described with reference to FIG. 1 and FIG. 2. A previous scan signal Sn-1 of a low logic level (e.g., low voltage level)

is supplied to the pixel PX through the previous scan line 152 during an initialization period. Then, the initialization transistor T4 is turned on depending on the previous scan signal Sn-1 of the low level, and an initialization voltage Vint is applied from the initialization voltage line 192 to the gate electrode G1 of the driving transistor T1 through the initialization transistor T4 to initialize the driving transistor T1 by the initialization voltage Vint.

Next, a scan signal Sn of a low logic level is supplied to the pixel PX through the scan line 151 during a data programming period. Then, the switching transistor T2 and the compensation transistor T3 are turned on depending on the scan signal Sn of the low logic level, and the driving transistor T1 is diode-connected by the compensation transistor T3 to be biased in a forward direction. Then, a compensation voltage (Dm+Vth, Vth being a negative value), which has been reduced by a threshold voltage Vth of the driving transistor T1 from a data signal Dm transferred through the data line 171, is applied to the gate electrode G1 of the driving transistor T1. The driving voltage ELVDD and the compensation voltage (Dm+Vth) are applied to the two storage electrodes E1 and E2 of the storage capacitor Cst, and a charge corresponding to a voltage difference between the two sustain electrodes E1 and E2 is stored in the storage capacitor Cst.

Next, the emission control signal EM supplied from the emission control line 153 changes from a high logic level to a low logic level, and the operation control transistor T5 and the emission control transistor T6 are turned on by the emission control signal EM having a low level during the emission period. Then, a driving current Id corresponding to the voltage difference between the gate voltage of the gate electrode G1 of the driving transistor T1 and the driving voltage ELVDD is generated, and the driving current Id is supplied to the organic light emitting diode OLED through the emission control transistor T6. A gate-source voltage Vgs of the driving transistor T1 is maintained as "(Dm+Vth)-ELVDD" by the storage capacitor Cst during the emission period. Depending on a current-voltage relationship of the driving transistor T1, the driving current Id is proportional to "(Dm-ELVDD)$^2$", which is a square of a value obtained by subtracting the threshold voltage Vth from the source-gate voltage Vgs. Accordingly, the driving current Id is determined regardless of the threshold voltage Vth of the driving transistor T1, and thus non-uniformity of a characteristic of the driving transistor T1 that may occur due to, e.g., process dispersion, can be ameliorated.

The bypass transistor T7 disperses some of a minimum current (e.g., a current under the condition that the driving transistor T1 is turned off because the gate-source voltage Vgs of the driving transistor T1 is smaller than the threshold voltage Vth) of the driving transistor T1 as a bypass current Ibp into a current path other than the current path of the organic light emitting diode. Accordingly, a black gray can be displayed more accurately, and a contrast ratio can be enhanced. In FIG. 1, the bypass signal BP is identical to a previous scan signal Sn-1, but the present inventive concept is not limited thereto.

Hereinafter, a structure of the organic light emitting diode display according to an embodiment will be described with reference to FIG. 3 to FIG. 6.

Figure 3:
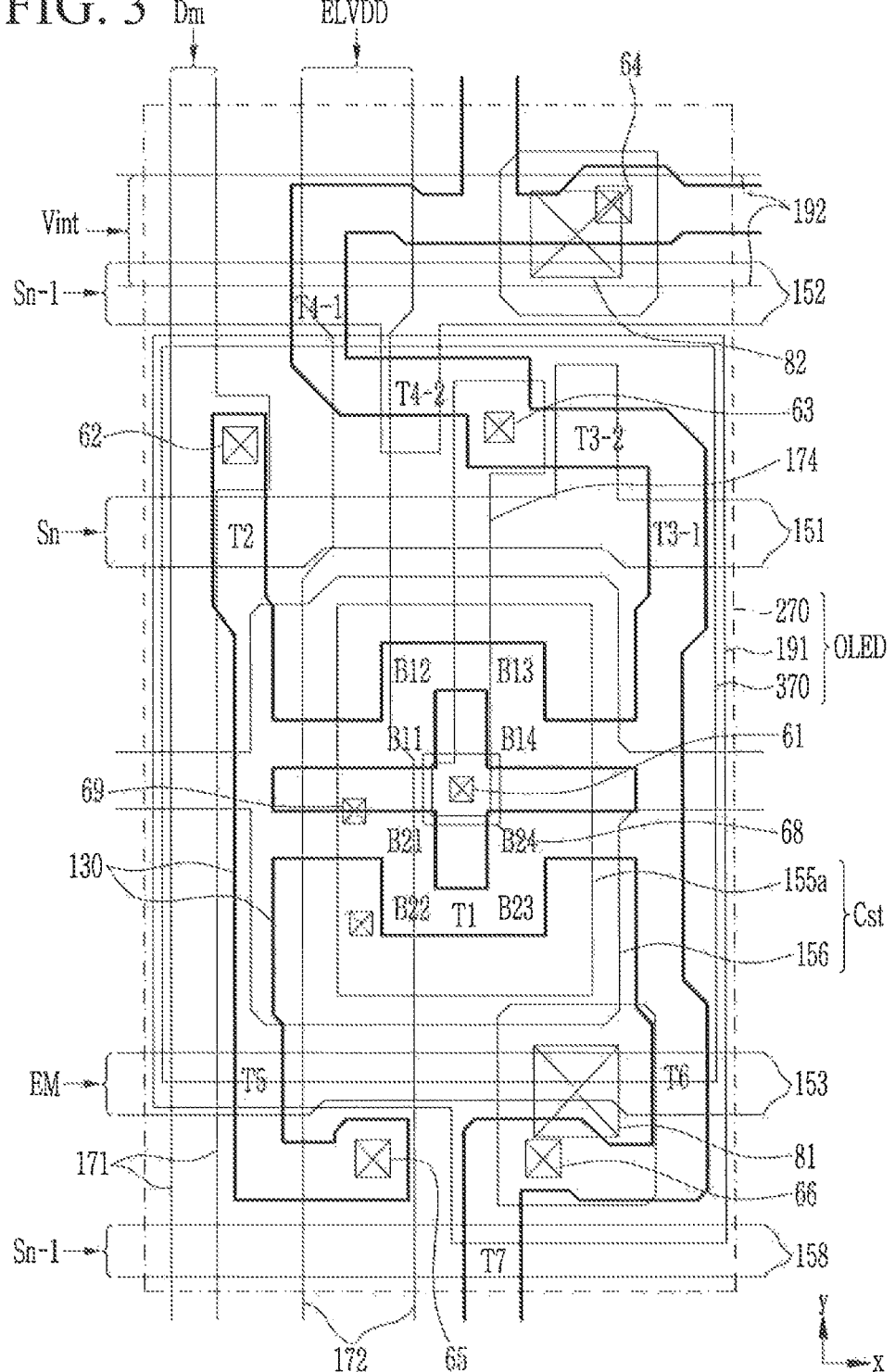
FIG. 3 and FIG. 4 are layout views illustrating one pixel area of an organic light emitting diode display according to an embodiment of the inventive concept.
Figure 4:
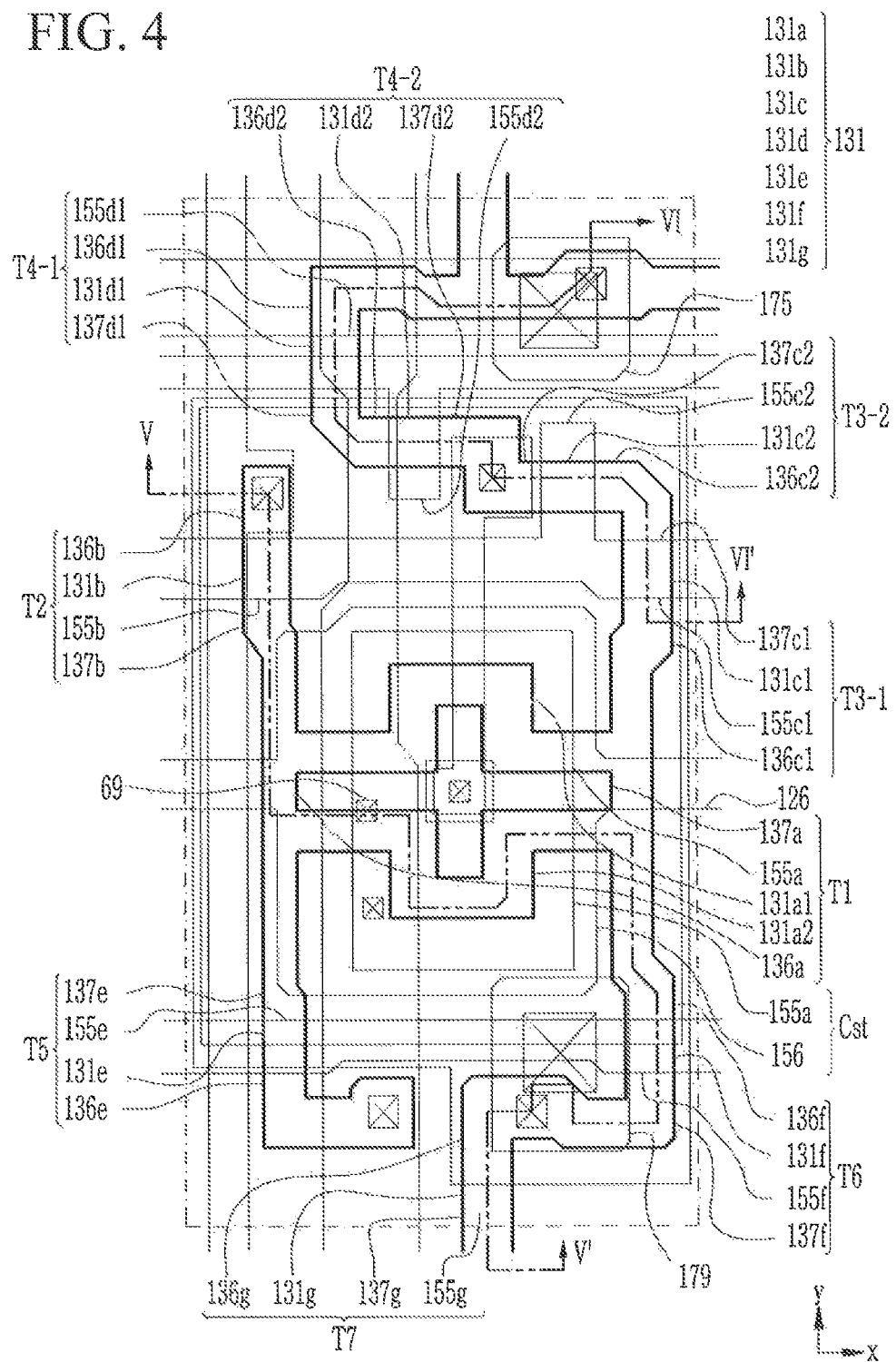
Figure 5:
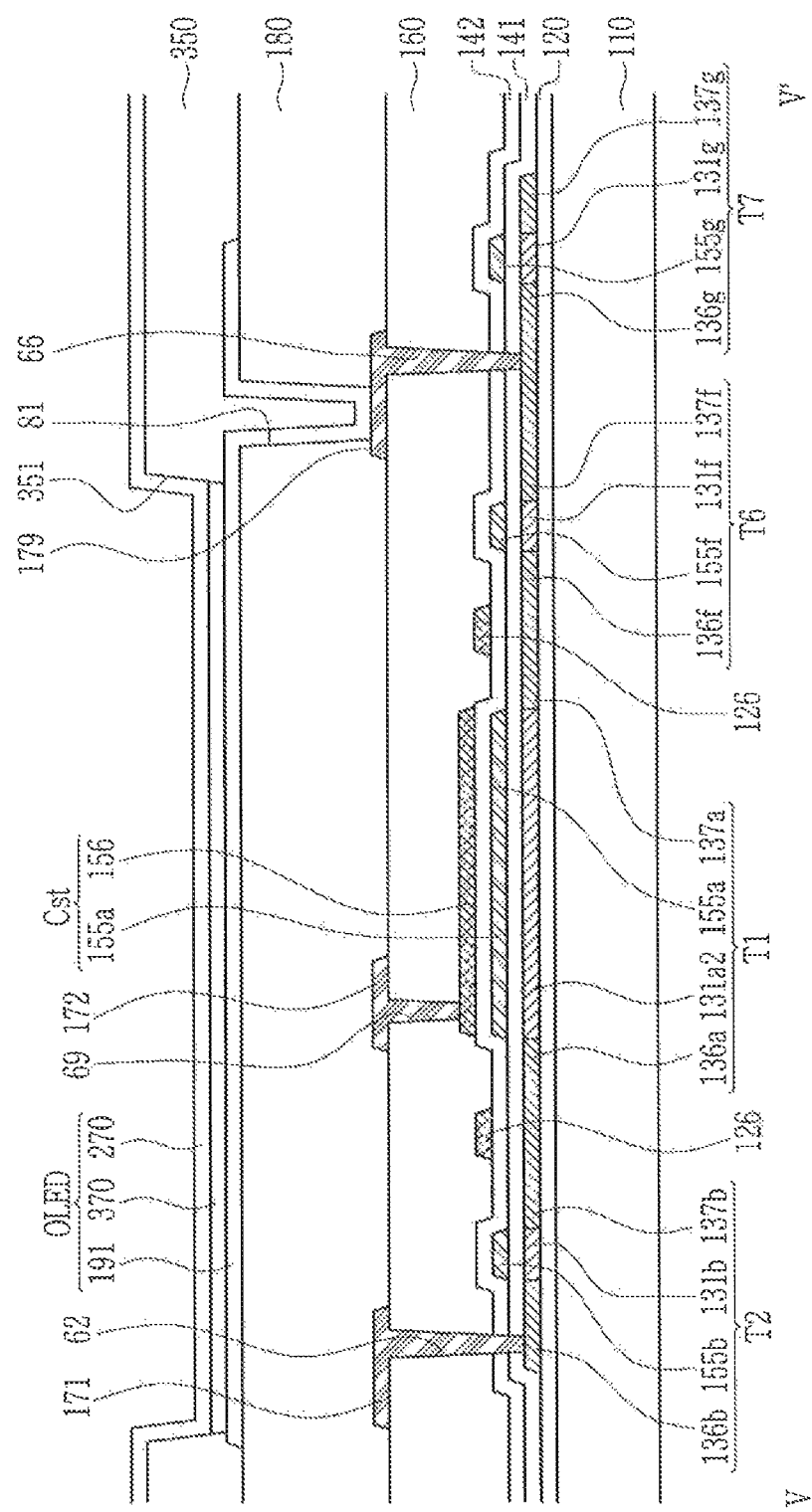
FIG. 5 is a cross-sectional view taken along a line V-V' in FIG. 4.
Figure 6:
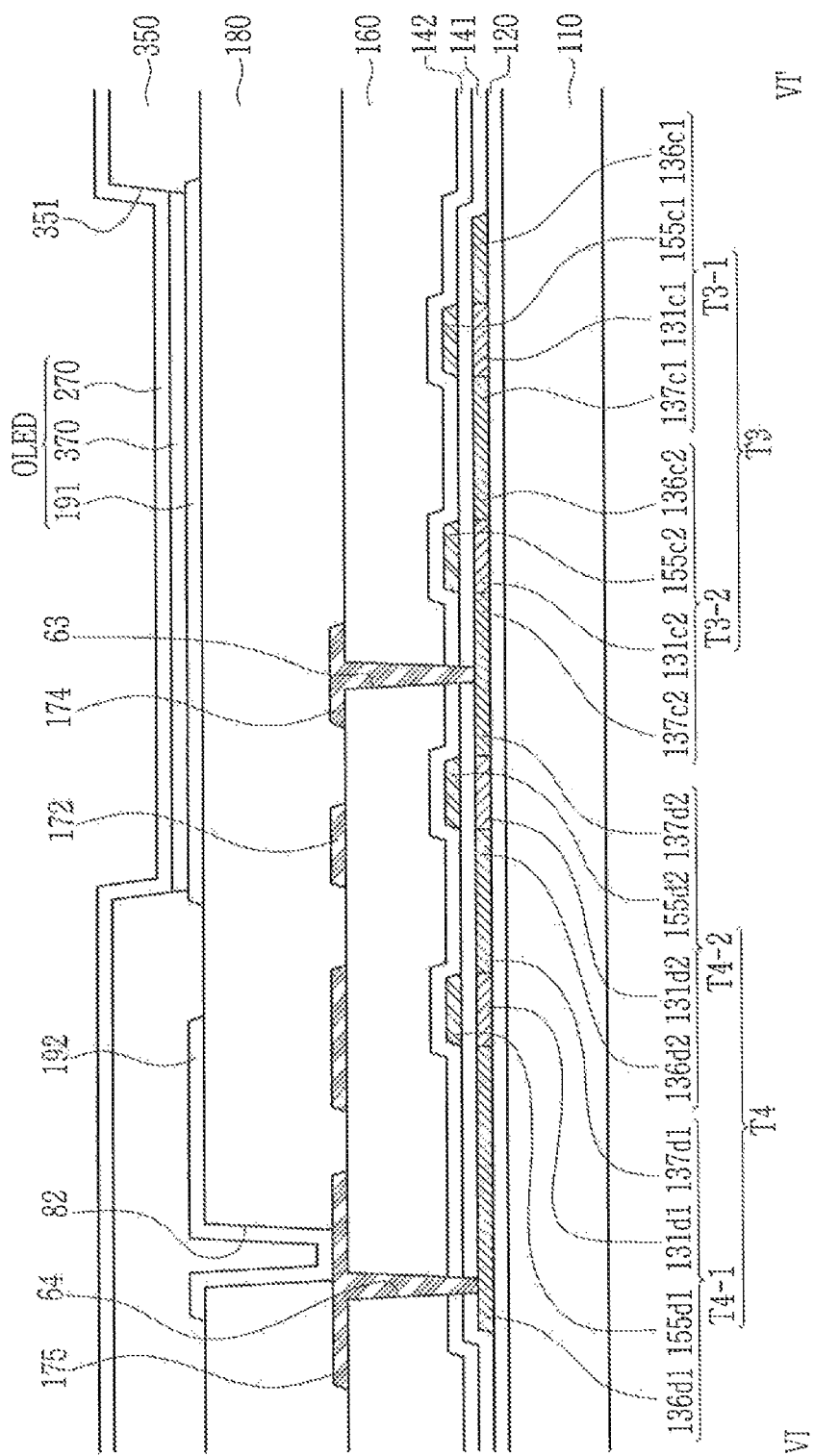
FIG. 6 is a cross-sectional view taken along a line VI-VI' in FIG. 4.

FIG. 3 and FIG. 4 are layout views illustrating one pixel area of an organic light emitting diode display according to an embodiment of the inventive concept, FIG. 5 is a cross-sectional view taken along a line V-V' in FIG. 4, and FIG. 6 is a cross-sectional view taken along a line VI-VI' in FIG. 4.

For example, a detailed planar structure of the organic light emitting diode display will be described with reference to FIG. 3 and FIG. 4, and a sectional structure thereof will be described with reference to FIG. 5 and FIG. 6. FIG. 3 and FIG. 4 are the same layout view, with different items being identified with reference numerals to reduce the clutter that would occur with all the items being identified in a single drawing. Accordingly, two drawings (FIG. 3 and FIG. 4) are used for the convenience of a person of ordinary skill in the art.

Referring now to FIG. 3 and FIG. 4, the organic light emitting diode display according to the present embodiment may include a scan line 151 extended mainly in a first direction "x" to transfer the scan signal Sn, the previous scan signal Sn-1, the emission control signal EM, and the bypass signal BP, a previous scan line 152, an emission control line 153, and a bypass control line 158. The organic light emitting diode display includes a data line 171 and a driving voltage line 172 extended mainly in a second direction "y" that crosses the first direction x to transfer the data signal Dm and the driving voltage ELVDD, respectively. An initialization voltage Vint is transferred from the initialization voltage line 192 to the compensation transistor T3 via the initialization transistor T4.

The organic light emitting diode display includes a driving transistor T1, a switching transistor T2, a compensation transistor T3, an initialization transistor T4, an operation control transistor T5, an emission control transistor T6, a bypass transistor T7, a storage capacitor Cst, and an organic light emitting diode OLED. The organic light emitting diode OLED is formed to include a pixel electrode 191, an organic light emitting layer 370, and a common electrode 270. The compensation transistor T3 and the initialization transistor T4 may have a dual-gate structure for blocking a leakage current.

Each channel of the driving transistor T1, switching transistor T2, compensation transistor T3, initialization transistor T4, operation control transistor T5, emission control transistor T6, and bypass transistor T7 is formed in one semiconductor 130 that extends longitudinally. The semiconductor 130 may be bent in various shapes and is not limited to the shape shown in FIG. 3 and FIG. 4. The semiconductor 130 may include a polycrystalline semiconductor such as polysilicon, or an oxide semiconductor. The oxide semiconductor may be an oxide basically formed of, for example, titanium (Ti), hafnium (Hf), zirconium (Zr), aluminum (Al), tantalum (Ta), germanium (Ge), zinc (Zn), gallium (Ga), tin (Sn), or indium (In), or a complex oxide thereof. When the semiconductor 130 is made of an oxide semiconductor, a separate passivation layer may be added to protect the oxide semiconductor, which is susceptible to an external environment such as high temperature.

The semiconductor 130 includes a channel doped with an N-type impurity or a P-type impurity, and a source doping region and a drain doping region formed at opposite sides of the channel to have a higher doping concentration than the impurity doped into the channel. In the illustrated embodiment, the source doping region and the drain doping region respectively correspond to a source electrode and a drain electrode of a transistor. In addition, in the semiconductor 130, regions between source electrodes and drain electrodes of different transistors may be doped to electrically connect the source electrode of the first transistor with the drain electrode of the second transistor.

Referring now to FIG. 4, a channel 131 includes a channel 131a of the driving transistor T1, a channel 131b of the switching transistor T2, a channel 131c of the compensation transistor T3, a channel 131*d* of the initialization transistor T4, a channel 131*e* of the operation control transistor T5, a channel 131*f* of the emission control transistor T6, and a channel 131*g* of the bypass transistor T7. Hereinafter, each channel is named for a corresponding transistor. For example, the channel 131*a*, the channel 131*b*, the channel 131*c*, the channel 131*d*, the channel 131*e*, the channel 131*f*, and the channel 131*g* may be respectively referred to as the driving channel 131*a*, the switching channel 131*b*, the compensation channel 131*c*, the initialization channel 131*d*, the operation control channel 131*e*, the emission control channel 131*f*, and the bypass channel 131*g*.

The driving transistor T1 includes a first driving channel 131*a*1, a second driving channel 131*a*2, a gate electrode 155*a*, a source electrode 136*a*, and a drain electrode 137*a*. The first and second driving channels 131*a*1 and 131*a*2 are separately disposed between the source electrode 136*a* and the drain electrode 137*a* to overlap the gate electrode 155*a*. Each of the driving channels 131*a*1 and 131*a*2 is bent. For example, the first and second driving channels 131*a*1 and 131*a*2 may have a meandering shape or a zigzag shape. Accordingly, the first and second driving channels 131*a*1 and 131*a*2 may be longitudinally formed at a limited region. In the illustrated embodiment, each of the driving channels 131*a*1 and 131*a*2 includes three horizontal portions substantially in parallel with the first direction x and two vertical portions substantially in parallel with the second direction y. Accordingly, the driving channels 131*a*1 and 131*a*2, as shown in FIG. 3, respectively include four curved portions B11, B12, B13, and B14 and B21, B22, B23, and B24 formed by horizontal portions and vertical portions that meet each other, and each of the driving channels 131*a*1 and 131*a*2 has a structure that is bent in four places. A person of ordinary skill in the art should understand and appreciate that the inventive concept is not limited to a number of shape of the bent places as shown in FIG. 3.

As a length of the driving channels 131*a*1 and 131*a*2 increases, a driving range of a gate voltage Vg applied to the gate electrode 155*a* of the driving transistor T1 is widened. Since the driving range of the gate voltage Vg is widened, a size of the gate voltage Vg may be changed for more precise control of a gray of light emitted from the organic light emitting diode OLED. Accordingly, it is possible to enhance display quality of the organic light emitting diode display. In addition, according to an embodiment of the inventive concept, the driving channels 131*a*1 and 131*a*2 do not extend in one direction but extend in various directions. Thus, an influence on the directionality in the manufacturing process is canceled out and an influence of the process dispersion can be reduced. Accordingly, the inventive concept may prevent a deterioration in image quality such as a stain defect (for example, even if the same data voltage Dm is applied, a luminance difference occurs depending on the pixel) that may occur due to variations in the characteristic of the driving transistor T1 depending on the region of the display device due to the process dispersion. A shape of the driving channels 131*a*1 and 131*a*2 is not limited to the illustrated Ω type, and may be variously modified into a shape such as, for example, an S type, a reverse S type, an M type, or a W type.

The structure of a driving channel with a curved shape as shown in one or more embodiments of the inventive concept may provide for an increase in the driving range and. may preventing image quality degradation. However there may be difficulty in supplying a high current (e.g., about 100 nA to about 1 µA, or about 1 µA or more) to the organic light emitting diode OLED due to an increase in channel length, and thus there can be difficulty in implementing high luminance. Accordingly, the driving channel according to the present embodiment includes a plurality of driving channels, e.g., first and second driving channels 131*a*1 and 131*a*2 as illustrated therein to supply, for example, a high current for high luminance while maintaining the benefits of the bent shape of the driving channel. Since the driving channel width is increased by the structure of the driving channels, the driving transistor T1 may supply a high driving current Id.

The first driving channel 131*a*1 and the second driving channel 131*a*2 are connected in parallel with each other via the source electrode 136*a* and the drain electrode 137*a*. Accordingly, the driving transistor T1 may include the two driving channels 131*a*1 and 131*a*2 connected in parallel. The first driving channel 131*a*1 and the second driving channel 131*a*2 overlap each other, but are separated from each other in a region that overlaps the gate electrode 155*a*. The first driving channel 131*a*1 and the second driving channel 131*a*2 may be symmetrical about an axis therebetween (e.g., an axis parallel to the first direction x).

The first driving channel 131*a*1 and the second driving channel 131*a*2 may have the same shape and size, which may increase a likelihood that the first driving channel 131*a*1 and the second driving channel 131*a*2 will exhibit a same characteristic. Even so, there is a possibility that the first driving channel 131*a*1 and the second driving channel 131*a*2 may have different characteristics. When the first driving channel 131*a*1 and the second driving channel 131*a*2 are positioned in a small area (e.g., within about 40 µA in the second direction y), the process dispersion may hardly be generated, thereby obtaining almost the same characteristics. Accordingly, according to the inventive concept, the issue of degradation of the output characteristic of the driving transistor T1 due to the driving channels is reduced or eliminated. When the organic light emitting display is used in a bright surrounding environment such as an outdoor environment, a brighter image display is required. In this case, since a current region in which dispersion due to the characteristic difference of the driving channel being hardly observed is mainly used, a risk of image quality deterioration due to the characteristic difference of the driving channel due to the driving channels is small. Although two parallel driving channels 131*a*1 and 131*a*2 are illustrated in FIG. 4, the driving transistor T1 may include more than two driving channels.

The driving channels may have different shapes and/or sizes.

For example, the driving channels of the driving transistor T1 may be applied to all the pixels, but may be applied differently depending on colors of the pixels. For example, when the organic light emitting display diode includes a red pixel, a green pixel, and a blue pixel, and efficiency of the blue pixel is relatively low, the driving channels may be applied only to the blue pixel, or two driving channels may be applied to the red pixel and the green pixel while three or more driving channels may be applied to the blue pixel. Although a same number of driving channels are applied to all the pixels irrespective of the colors of the pixels, a larger driving channel may be applied to the blue pixel.

With continued reference to FIGS. 3 and 4, the gate electrode 155*a* overlaps the first and second driving channels 131*a*1 and 131*a*2. The source electrode 136*a* and the drain electrode 137*a* are respectively adjacently formed at opposite sides of the first and second driving channels 131*a*1 and 131*a*2. The gate electrode 155*a* is connected with a first data connecting member 174 through a contact hole 61. An opening 66 through which the second data connecting member 175 may extend is formed in a second storage electrode 156 for such connection. In the illustrated embodiment, the contact hole 61 is positioned between the first driving channel 131a1 and the second driving channel 131a2. The position may be modified within a region that overlaps the gate electrode 155a without being limited thereto.

According to an embodiment of the inventive concept, about 50% or more of the first and second driving channels 131a1 and 131a2 may overlap the pixel electrode 191. A distance from a center (e.g., corresponding to a position at which the contact hole 61, is illustrated in FIG. 3) of the first and second driving channels 131a1 and 131a2 to a contact hole 66 may be within about 100 μm.

The switching transistor T2 includes the switching channel 131b, a gate electrode 155b, a source electrode 136b, and a drain electrode 137b. The gate electrode 155b which may be a part of the scan line 151 overlaps the switching channel 131b. The source electrode 136b and the drain electrode 137b are respectively adjacently formed at opposite sides of the switching channel 131b. The source electrode 136b is connected with the data line 171 through a contact hole 62.

The compensation transistor T3 includes a first compensation transistor T3-1 and a second compensation transistor T3-2 which are adjacent to each other. The first compensation transistor T3-1 includes a first compensation channel 131c1, a gate electrode 155c1, a source electrode 136c1, and a drain electrode 137c1, and the second compensation transistor T3-2 includes a second compensation channel 131c2, a gate electrode 155c2, a source electrode 136c2, and a drain electrode 137c2.

The gate electrode 155c1 which may be a part of the scan line 151 overlaps the first compensation channel 131c1. The source electrode 136c1 and the drain electrode 137c1 are respectively adjacently formed at opposite sides of the first compensation channel 131c1. The source electrode 136c1 is connected with the source electrode 136f and the drain electrode 137a, and the drain electrode 137c1 is connected with the source electrode 136c2. The gate electrode 155c2 which may be a protrusion of the scan line 151 overlaps the second compensation channel 131c2. The source electrode 136c2 and the drain electrode 137c2 are respectively adjacently formed at opposite sides of the second compensation channel 131c2. The drain electrode 137c2 is connected with the first data connecting member 174 through a contact hole 63.

In addition, the initialization transistor T4 includes a first initialization transistor T4-1 and a second initialization transistor T4-2. The first initialization transistor T4-1 includes a first initialization channel 131d1, a gate electrode 155d1, a source electrode 136d1, and a drain electrode 137d1. The second initialization transistor T4-2 includes a second initialization channel 131d2, a gate electrode 155d2, a source electrode 136d2, and a drain electrode 137d2.

The gate electrode 155d1, which may be a part of the previous scan line 152, may overlap the first initialization channel 131d1. The source electrode 136d1 and the drain electrode 137d1 may be respectively adjacently formed at opposite sides of the first initialization channel 131d1. The source electrode 136d1 is connected with a second data connecting member 175 through a contact hole 64, and the drain electrode 137d1 is connected with the second initialization source electrode 136d2. The gate electrode 155d2 which may be a protrusion of the previous scan line 152 overlaps the second initialization channel. 131d2. The source electrode 136d2 and the drain electrode 137d2 are respectively adjacently formed at opposite sides of the second initialization channel 131c2. The drain electrode 137d2 is connected with the first data connecting member 174 through the contact hole 63.

With such construction as in this embodiment of the inventive concept, electron movement paths of the channels 131c1, 131c2, 131d1, and 131d2 may be cut off by forming the first and second compensation transistors T3-1 and T3-2 as the compensation transistor 13, and the first and second initialization transistors T4-1 and T4-2 as the initialization transistor T4, to effectively prevent occurrence of a leakage current.

With regard to the operation control transistor T5, there includes an operation control channel 131e, a gate electrode 155e, a source electrode 136e, and a drain electrode 137e. The gate electrode 155e, which may be a part of the emission control line 153, overlaps the operation control channel 131e. The source electrode 136e and the drain electrode 137e are respectively adjacently formed at opposite sides of the operation control channel 131e. The source electrode 136e is connected with the driving voltage line 172 through a contact hole 65.

With regard to the emission control transistor T6, there includes an emission control channel 131f, a gate electrode 155f, a source electrode 136f, and a drain electrode 137f. The gate electrode 155f, which may be a part of the emission control line 153, overlaps the emission control channel 131f. The source electrode 136f and the drain electrode 137f are respectively adjacently formed at opposite sides of the emission control channel 131f. The drain electrode 137f is connected with a third data connecting member 179 through the contact hole 66.

With regard to the bypass transistor T7, there includes a bypass channel 131g, a gate electrode 155g, a source electrode 136g, and a drain electrode 137g. The gate electrode 155g, which may be a part of the bypass control line 158, overlaps the bypass channel 131g. The source electrode 136g and the drain electrode 137g are respectively adjacently formed at opposite sides of the bypass channel 131g. The source electrode 136g is connected with the third data connecting member 179 through a contact hole 81, and the drain electrode 137g is connected with the first initialization source electrode 136d1.

The storage capacitor Cst includes a first storage electrode 155a and a second storage electrode 156 which overlap each other with an insulating layer therebetween. The first storage electrode 155a may correspond to the gate electrode 155a, and the second storage electrode 156 may be an expanded part of a storage line 126. The second storage electrode 156 may occupy a larger area than the gate electrode 155a to completely cover the gate electrode 155a. Herein, the insulating layer is made of a dielectric material, and a storage capacitance is determined by a voltage between a charge charged in the storage capacitor Cst and the storage electrodes E1 and E2. According to an embodiment of the inventive concept, a space for forming a storage capacitor may be secured in a space narrowed by the first and second driving channels 131a1 and 131a2 occupying a relatively large area in the pixel, by using the gate electrode 155a as the first storage electrode 155a.

The first storage electrode 155a, which is the gate electrode 155a, is connected with a first end of the first data connecting member 174 through the contact hole 61 and the opening 68. The opening 68 is formed in the second storage electrode 156. The first data connecting member 174 is formed substantially in parallel with the data line 171 at a same layer as that of the data line 171. A second end of the first data connecting member 174 is connected with the drain electrode 137c2 of the second compensation transistor T3-2 and the drain electrode 137d2 of the second initialization transistor T4-2 through the contact hole 63. Accordingly, the first data connecting member 174 connects the gate electrode 155a of the driving transistor T1, the drain electrode 137c2 of the second compensation transistor T3-2, and the drain electrode 137d2 of the second initialization transistor T4-2.

The second storage electrode 156 is connected with the driving voltage line 172 through a contact hole 69. Accordingly, the storage capacitor Cst stores a charge corresponding to a difference between the gate voltage Vg of the driving gate electrode 155a and the driving voltage ELVDD transferred to the second storage electrode 156 through the driving voltage line 172.

The third data connecting member 179 is connected with the pixel electrode 191 through the contact hole 81, and the second data connecting member 175 is connected with the initialization voltage line 192 through a contact hole 82.

A planar structure of an organic light emitting diode display according to an embodiment will now be described depending on a stacking order with reference to FIG. 5 and FIG. 5. FIG. 3 and FIG. 4 are also referenced even without special mention. The operation control transistor T5 has a stacked structure substantially similar to that of the emission control transistor T6, and thus a detailed description will be omitted.

A buffer layer 120 is disposed on a substrate 110. The substrate 110 may be formed of an insulating material such as plastic, glass, quartz, ceramic, or the like. The buffer layer 120 may be formed, for example, to prevent impurities that degrade characteristics of the semiconductor 130 from being diffused and to prevent penetration of moisture or the like.

The semiconductor 130 including the first and second driving channels 131a1 and 131a2, the switching channel 131b, the compensation channel 131c, the initialization channel 131d, the operation control channel 131e, the emission control channel 131f, and the bypass channel 131g is disposed on the buffer layer 120. In the semiconductor 130, the source electrode 136a and the drain electrode 137a are formed at opposite sides of the first and second driving channels 131a1 and 131a2, and the source electrode 136b and the drain electrode 137b are formed at opposite sides of the switching channel 131b. Similarly, the source electrode 136c1 and the drain electrode 137c1 are formed at opposite sides of the first compensation channel 131c1, the source electrode 136c2 and the drain electrode 137c2 are formed at opposite sides of the second compensation channel 131c2, the source electrode 136d1 and the drain electrode 137d1 are formed at opposite sides of the first initialization channel 131d1, and the source electrode 136d2 and the drain electrode 137d2 are formed at opposite sides of the second initialization channel 131d2. In addition, the source electrode 136e and the drain electrode 137e are formed at opposite sides of the operation control channel 131e, the source electrode 136f and the drain electrode 137f are formed at opposite sides of the emission control channel 131f, and the source electrode 136g and the drain electrode 137g are formed at opposite sides of the bypass channel 131g.

A first gate insulating layer 141 is disposed on the semiconductor 130 to cover the semiconductor 130. The scan line 151 including the gate electrode 155b and the gate electrodes 155c1 and 155c2, the previous scan line 152 including the gate electrodes 155d1 and 155d2, the emission control line 153 including the gate electrodes 155e and 155f, the bypass control line 158 including the gate electrode 155g, and a first gate conductor including the gate electrode (first storage electrode) 155a are disposed on the first gate insulating layer 141.

A second gate insulating layer 142 for covering the first gate conductor and the first gate insulating layer 141 is disposed on the first gate conductor and the first gate insulating layer 141. Each of the first gate insulating layer 141 and the second gate insulating layer 142 is made of a silicon nitride($SiN_x$) or a silicon oxide ($SiO_y$).

A second gate conductor including the storage line 126 and the second storage electrode 156, which is a portion extended from the storage line 126, is disposed on the second gate insulating layer 142.

An interlayer insulating layer 160 is disposed on the second gate insulating layer 142 and the second gate conductor. The interlayer insulating layer 160 is made of a silicon nitride ($SiN_x$) or a silicon oxide ($SiO_y$).

Contact holes 61, 62, 63, 64, 65, 66, and 69 are formed in the interlayer insulating layer 160. A data conductor including the data line 171, the driving voltage line 172, the first data connecting member 174, the second data connecting member 175, and the third data connecting member 179 is disposed on the interlayer insulating layer 160.

The data line 171 is connected with the source electrode 136b through the contact hole 62 formed in the first gate insulating layer 141, the second gate insulating layer 142, and the interlayer insulating layer 160. A first end of the first data connecting member 174 is connected with the first storage electrode 155a through the contact hole 61 formed in the second gate insulating layer 142 and the interlayer insulating layer 160, and a second end of the first data connecting member 174 is connected with the drain electrode 137c2 and the drain electrode 137d2 formed in the first gate insulating layer 141, the second gate insulating layer 142, and the interlayer insulating layer 160.

The second data connecting member 175 is connected with the source electrode 136d1 through the contact hole 64 formed in the first gate insulating layer 141, the second gate insulating layer 142, and the interlayer insulating layer 160. The third data connecting member 179 is connected with the drain electrode 137f through the contact hole 66 formed in the first gate insulating layer 141, the second gate insulating layer 142, and the interlayer insulating layer 160.

A passivation layer 180 for covering the data conductor and the interlayer insulating layer 160 is disposed on the data conductor and the interlayer insulating layer 160. The passivation layer 180 may include an organic insulating material.

A pixel electrode 191 and an initialization voltage line 192 are disposed on the passivation layer 180. The third data connecting member 179 is connected with the pixel electrode 191 through the contact hole 81 formed in the passivation layer 180, and the second data connecting member 175 is connected with the initialization voltage line 192 through the contact hole 82 formed in the passivation layer 180.

A pixel definition layer 350 is disposed on the passivation layer 180, the initialization voltage line 192, and the pixel electrode 191. The pixel definition layer 350 has an opening 351 that overlaps the pixel electrode 191. The pixel definition layer 350 may include an organic insulating material such as polyimide, polyacrylate, or polyamide, and may include a silica-based inorganic insulating material.

An organic light emitting layer 370 is disposed on the pixel electrode 191. The organic light emitting layer 370 may include a first organic common layer, an emission layer, and a second organic common layer sequentially stacked. The first organic common layer may include at least one of the hole-injection layer and the hole-transporting layer. The emission layer may be formed of an organic material that uniquely emits light of a basic color such as red, green, and blue, or may have a structure in which a plurality of organic material layers emitting light of different colors are stacked. The second organic common layer may include at least one of the electron-transporting layer and the electron-injection layer. A common electrode 270 is disposed on the organic light emitting layer 370. The common electrode 270 may be disposed across a plurality of pixels.

The pixel electrode 191, the organic light emitting layer 370, and the common electrode 270 constitute the organic light emitting diode OLED. The pixel electrode 191 may be an anode, which is a hole-injection electrode, and the common electrode 270 may be a cathode, which is an electron-injection electrode. Conversely, the pixel electrode 191 may be a cathode, and the common electrode 270 may be an anode. Holes and electrons are injected into the organic light emitting layer 370 from the pixel electrode 191 and the common electrode 270, and light is emitted when excitons obtained by combining the injected holes and electrons fall from an excited state to a ground state.

An encapsulation layer (not illustrated) for protecting the organic light emitting diode OLED is disposed on the common electrode 270. The encapsulation layer may be a thin film encapsulation layer in which an inorganic film and an organic film are stacked.

Hereinafter, a planar shape of a driving transistor of an organic light emitting diode display according to some embodiments will be described focusing on a difference from the aforementioned embodiment of the inventive concept.

FIG. 7 to FIG. 15 schematically illustrate planar shapes of a gate electrode and a semiconductor layer of a driving transistor according to some embodiments of the inventive concept. They briefly illustrate a channel and a gate electrode of the driving transistor, and thus FIG. 3 and the like are referred to for other parts of the organic light emitting diode display.

Figure 7:
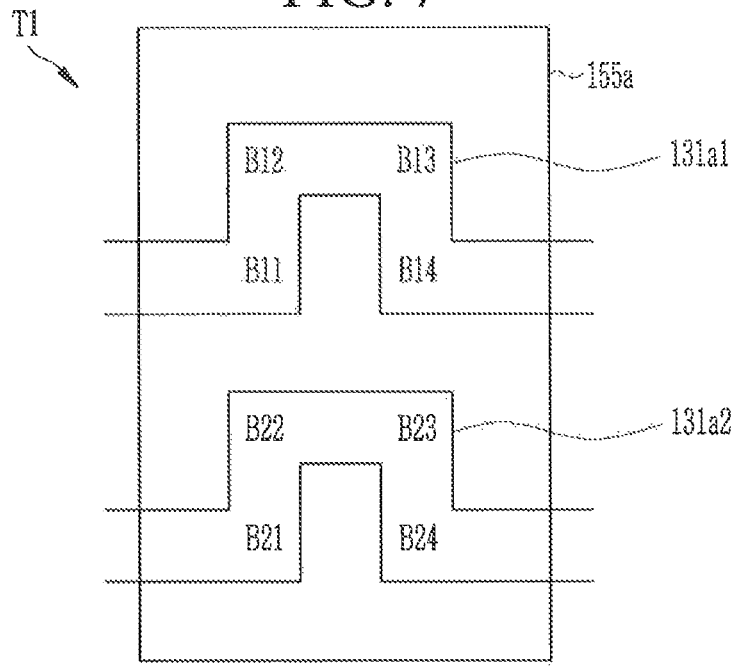

First, referring to FIG. 7, the driving transistor T1 includes two driving channels, e.g., a first driving channel 131a1 and a second driving channel 131a2, which overlap the gate electrode 155a. Similar to the embodiment of FIG. 3, the first driving channel 131a1 and the second driving channel 131a2 are connected with each other by the source electrode 136a and the drain electrode 137a therebetween, and respectively have approximately Ω-shapes including four curved portions B11, B12, B13, and B14, and B21, B22, B23, and B24. Unlike the embodiment of FIG. 3, the first driving channel 131a1 and the second driving channel 131a2 have the same shapes that are repeated up and down instead of being not symmetrical with respect to one axis therebetween.

Figure 8:
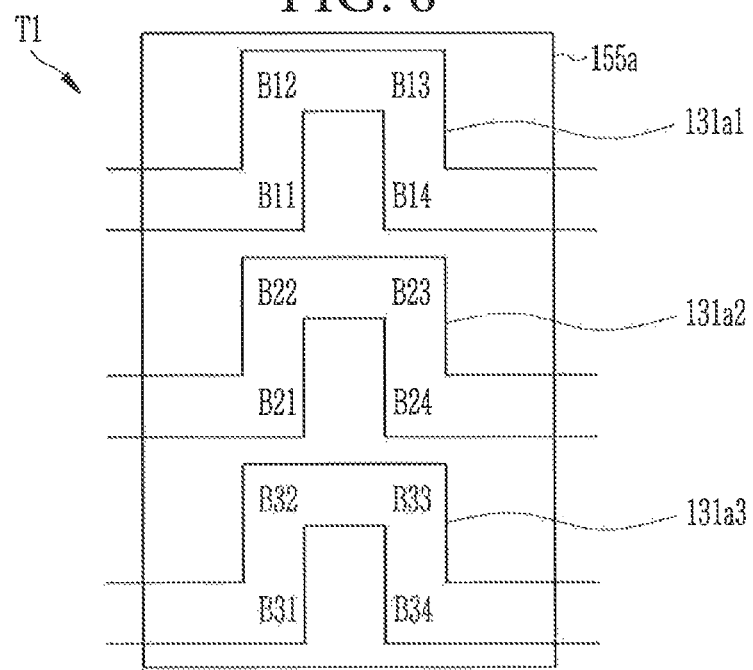

Referring to FIG. 8, the driving transistor T1 includes three driving channels 131a1, 131a2, and 131a3, each of which has the approximately Ω-shape of the driving channels 131a1, 131a2, and 131a3 overlap the gate electrode 155a, and are connected in parallel by the source electrode 136a and the drain electrode 137a at opposite sides thereof.

Figure 9:
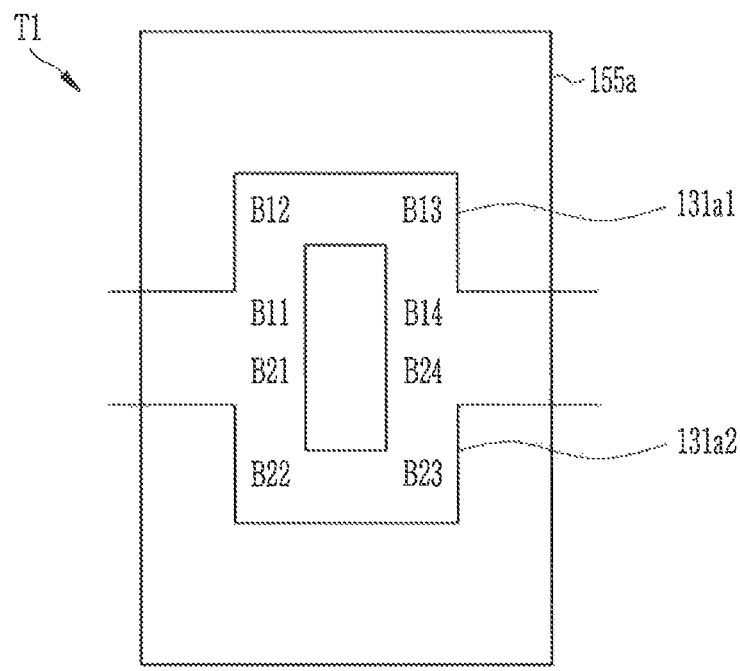
Figure 10:
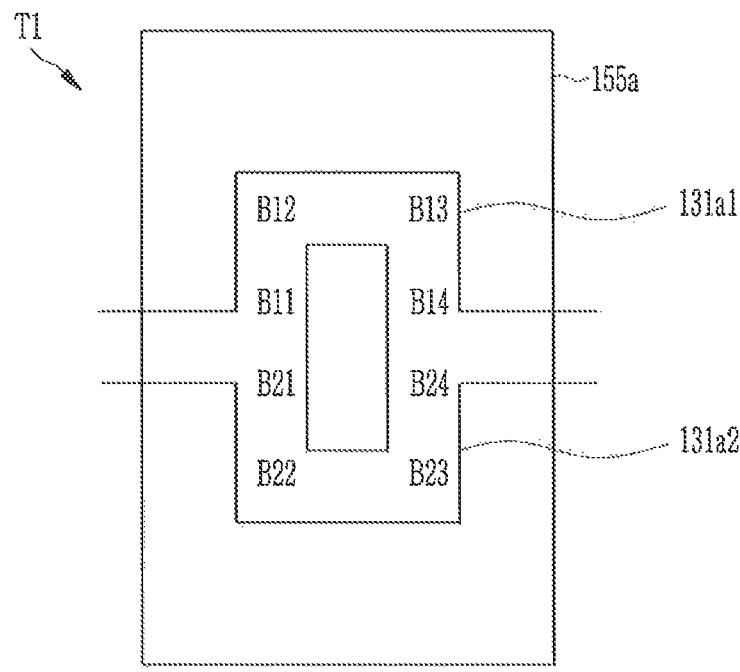
Figure 11:
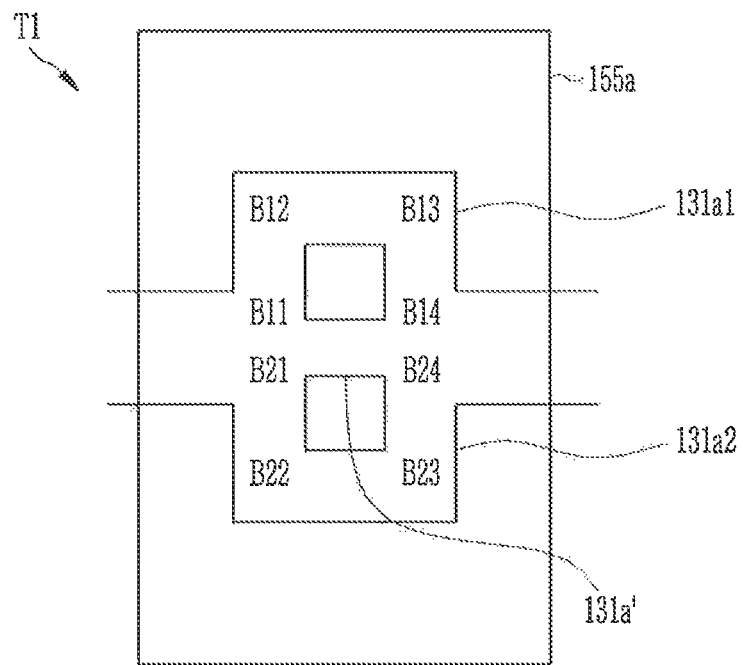

Referring to FIG. 9, the first and second driving channels 131a1 and 131a2 of the driving transistor T1 have a shape in which the first and second driving channels 131a1 and 131a2 of the embodiment of FIG. 3 are attached to each other. Referring to FIG. 10, the first and second driving channels 131a1 and 131a2 of the driving transistor T1 have a shape in which one driving channel branches into the upper first driving channel 131a and the lower second driving channel 131a2, and then merges into one driving channel. Referring to FIG. 11, the present embodiment is similar to the embodiment of FIG. 9. However, the driving transistor T1 further includes a connection channel 131a' for connecting the first driving channel 131a1 and the second driving channel 131a2 in a horizontal direction.

Figure 12:
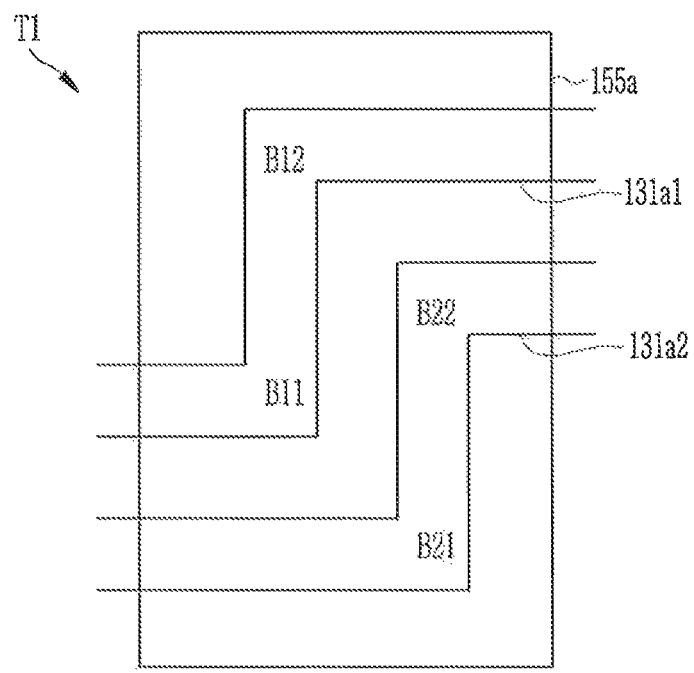
Figure 13:
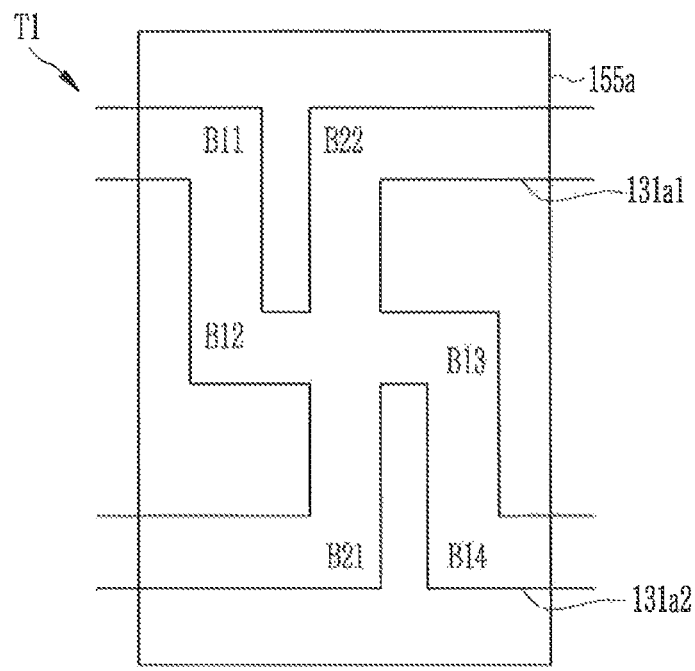

Referring to FIG. 12, the driving transistor T1 includes a first driving channel 131a1 and a second driving channel 131a2, each of which includes two curved portions B11 and B12 (B21 and B22). Referring to FIG. 13, the first driving channel 131a1 of the driving transistor T1 includes four curved portions B11, B12, B13, and B14, and the second driving channel 131a2 includes two bendable portions B21 and B22. The first driving channel 131a1 and the second driving channel 131a2 cross each other at an approximate central portion of the gate electrode 155a. In the embodiment of FIG. 12 and FIG. 13, the first and second driving channels 131a1 and 131a2 may not have the same shape to form the first and second driving channels 131a1 and 131a2 in a limited area.

Figure 14:
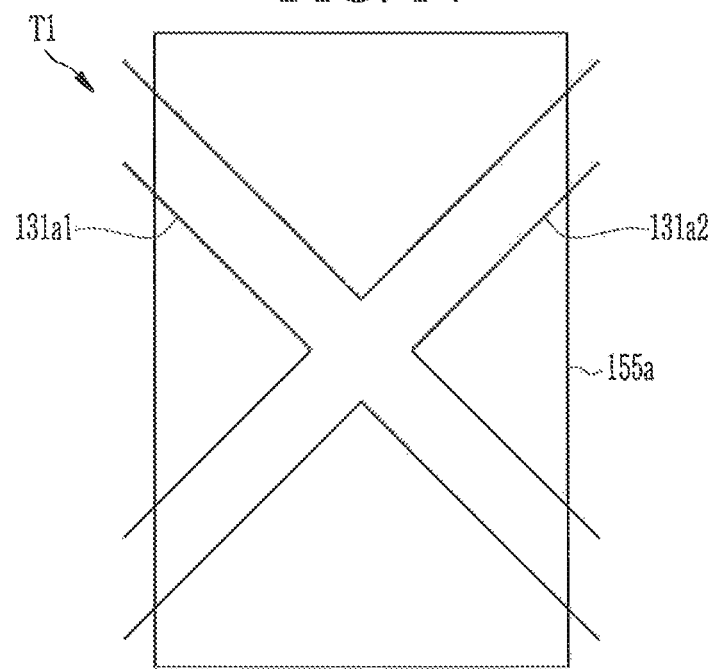

As such, the driving transistor T1 may include a plurality of driving channels of various shapes and numbers connected in parallel, and each driving channel includes a plurality of bending portions. According to an embodiment of the inventive concept, when there is substantial symmetry between the arrangement of the driving channels, including the bending portions, that may result in a high driving current supplied by the driving transistor, while the bending portions can result in a reduction of the effects of directionality that can accompany increased channel length. Referring to FIG. 14, the driving transistor T1 includes a first driving channel 131a1 extending downward in a diagonal direction and a second driving channel 131a2 extending upward in the diagonal direction. The first driving channel 131a and the second driving channel 131b intersect at an approximately central portion of the gate electrode 155a. Unlike the aforementioned embodiments, the first and second driving channels 131a and 131b1 do not include a bending portion but are formed in a straight line. Instead, since the first and second driving channels 131a and 131b are formed along an approximately diagonal line of the gate electrode 155a, a length of the first and second driving channels 131a and 131b may increase.

Figure 15:
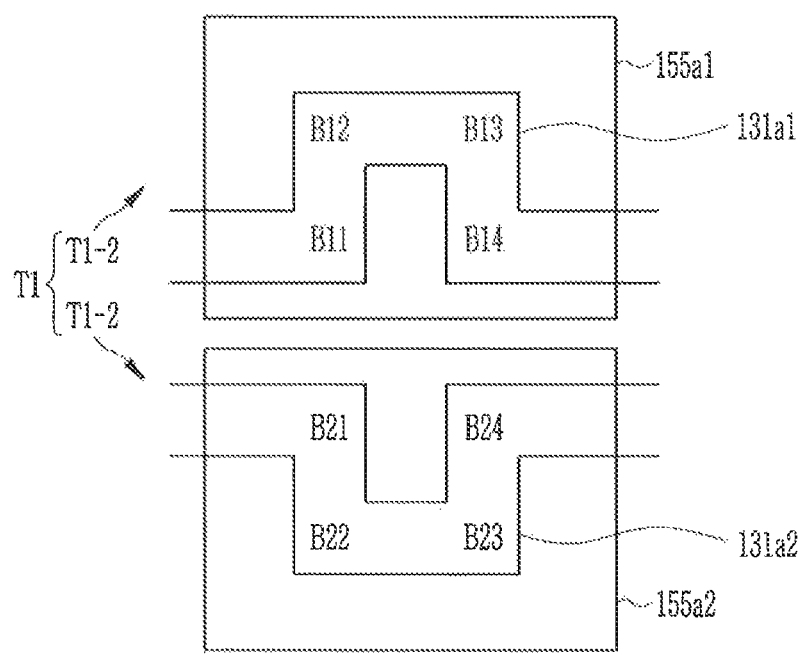

Referring to FIG. 15, although the first and second driving channels 131a1 and 131a2 of the driving transistor T1 are formed similarly to the embodiment of FIG. 3, the gate electrode is separated into a first gate electrode 155a1 and a second gate electrode 155a2. The first driving channel 131a1 overlaps the first gate electrode 155a1, and the second driving channel 131a2 overlaps the second gate electrode 155a2. The driving transistor T1 may include two transistors, e.g., a first driving transistor T1-1 and a second driving transistor T1-2, connected in parallel. This structure may be advantageous when compensation is difficult due to a difference in characteristics between the first driving channel 131a1 and the second driving channel 131a2. Since the gate electrodes are separately formed to correspond to the respective driving channels of the driving transistor T1, the respective driving channels may be individually compensated. Accordingly, it is possible to prevent degradation of an output characteristic of the driving transistor T1 caused by a plurality of driving channels whose characteristics are not uniform.

While this inventive concept has been described in connection with what is presently considered to be practical embodiments, it is to be understood that the inventive concept is not limited to the embodiments disclosed herein, but, on the contrary, covers various modifications and equivalent arrangements included within the spirit and scope of the appended claims.

What is claimed is:

1. An organic light emitting diode display comprising:
    a substrate;
    a scan line disposed on the substrate to transfer a scan signal;
    a data line disposed on the substrate to transfer a data signal;
    a driving voltage line disposed on the substrate to transfer a driving voltage;
    a switching transistor connected with the scan line and the data line;
    a driving transistor connected with the switching transistor; and
    an organic light emitting diode electrically connected to the driving transistor,
    wherein the driving transistor includes a gate electrode, a source electrode, a drain electrode, and a plurality of channels, and each of the plurality of channels includes a plurality of curved portions.

2. The organic light emitting diode display of claim 1, wherein the plurality of channels are disposed between the source electrode and the drain electrode, and are connected in parallel by the source electrode and the drain electrode.

3. The organic light emitting diode display of claim 2, wherein the plurality of channels include a first channel and a second channel, and
    the first channel and the second channel are symmetrically shaped with respect to an axis therebetween.

4. The organic light emitting diode display of claim 3, wherein the first channel and the second channel are connected with each other.

5. The organic light emitting diode display of claim 3, further comprising
    a storage electrode that overlaps the gate electrode and constitutes a storage capacitor together with the gate electrode,
    wherein the storage electrode has an opening positioned between the first channel and the second channel.

6. The organic light emitting diode display of claim 3, wherein the first channel and the second channel are separated from each other.

7. The organic light emitting diode display of claim 1, wherein when the switching transistor is turned on the data signal is transferred to the source electrode of the driving transistor, and further comprising a compensation transistor that connects the drain electrode of the driving transistor to the gate electrode of the driving transistor.

8. The organic light emitting diode display of claim 1, wherein each of the plurality of channels have a shape and size that are substantially the same.

9. The organic light emitting diode display of claim 1, wherein each of the plurality of channels has an approximate Ω-shape including four bent portions.

10. The organic light emitting diode display of claim 1, wherein the gate electrode includes a first gate electrode and a second gate electrode separated from each other,
    the plurality of channels include a first channel and a second channel separated from each other, and
    the first gate electrode overlaps the first channel, and the second gate electrode overlaps the second channel.

11. The organic light emitting diode display of claim 1, wherein the source electrode, the drain electrode, and the plurality of channels are formed in one semiconductor.

12. An organic light emitting diode display comprising:
    a scan line configured to transfer a scan signal;
    a data line configured to transfer a data signal;
    a driving voltage line configured to transfer a driving voltage;
    a switching transistor connected with the scan line and the data line;
    a driving transistor connected with the switching transistor; and
    an organic light emitting diode configured to receive a driving current of the driving transistor to emit light,
    wherein the driving transistor includes a plurality of channels connected in parallel, and each of the plurality of channels includes a bent structure viewable from a plan view of the driving transistor.

13. The organic light emitting diode display of claim 1, wherein each of the plurality of channels includes a first end and a second end opposite to the first end, wherein each of the first ends are connected to each other, and each of the second ends are connected to each other, and
    wherein each of the first ends are connected to different portions of the drain electrode, and each of the second ends are connected to different portions of the source electrode.

14. The organic light emitting diode display of claim 12, wherein the gate electrode includes a first gate electrode and a second gate electrode separated from each other,
    the plurality of channels include a first channel and a second channel separated from each other, and
    the first gate electrode overlaps the first channel, and the second gate electrode overlaps the second channel.

15. The organic light emitting diode display of claim 12, wherein the driving transistor includes a gate electrode, a source electrode, a drain electrode, and the plurality of channels being formed in one semiconductor, and
    each of the plurality of channels has a first end connected with the source electrode and a second end connected with the drain electrode.

16. The organic light emitting diode display of claim 15, wherein the plurality of channels include a first channel and a second channel that overlap the gate electrode, and
    the first channel and the second channel are symmetrical with respect to an axis therebetween.

17. The organic light emitting diode display of claim 16, wherein the first channel and the second channel are separated from each other.

18. The organic light emitting diode display of claim 16, wherein the first channel and the second channel are connected with each other.

19. The organic light emitting diode display of claim 16, further comprising:
    a storage electrode overlapping the gate electrode; and
    an insulating layer disposed between the gate electrode and the storage electrode,
    wherein the storage electrode has an opening positioned between the first channel and the second channel, and the insulating layer has a contact hole that overlaps the opening.

20. The organic light emitting diode display of claim 12, wherein the plurality of channels have a substantially same shape and size.

21. The organic light emitting diode display of claim 12, wherein each of the plurality of channels has an approximate Ω-shape including four bent portions.

* * * * *